United States Patent
Koenig

(10) Patent No.: US 8,350,366 B2
(45) Date of Patent: Jan. 8, 2013

(54) POWER SEMICONDUCTOR ELEMENT WITH TWO-STAGE IMPURITY CONCENTRATION PROFILE

(75) Inventor: Bernhard Koenig, Fuerth (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 58 days.

(21) Appl. No.: 13/164,643

(22) Filed: Jun. 20, 2011

(65) Prior Publication Data

US 2012/0007223 A1    Jan. 12, 2012

(30) Foreign Application Priority Data

Jun. 18, 2010  (DE) .................... 10 2010 024 257

(51) Int. Cl.
*H01L 29/36* (2006.01)

(52) U.S. Cl. ........ 257/657; 257/171; 257/653; 257/495; 257/496; 257/E29.109; 257/E29.012; 257/E29.013; 257/E29.201; 257/E27.051; 257/E29.329

(58) Field of Classification Search .................. 257/657, 257/171, 653, 495, 496, E29.109, E29.012, 257/E29.013, E29.201, E27.051, E29.329
See application file for complete search history.

(56) References Cited

U.S. PATENT DOCUMENTS

| 6,888,206 B2 | 5/2005 | Takahashi et al. |
| 7,635,909 B2 | 12/2009 | Mauder et al. |
| 7,642,599 B2 | 1/2010 | Ninomiya et al. |
| 7,696,600 B2 | 4/2010 | Mauder et al. |
| 7,812,427 B2 | 10/2010 | Mauder et al. |

FOREIGN PATENT DOCUMENTS

| DE | 43 37 329 | 5/1995 |
| DE | 10302628 | 12/2003 |
| DE | 10361136 | 7/2005 |
| DE | 102006025958 | 10/2007 |
| EP | 1 017 093 | 7/2000 |

*Primary Examiner* — Long Pham
(74) *Attorney, Agent, or Firm* — The Law Offices of Roger S. Thompson

(57) ABSTRACT

A power semiconductor component having a pn junction, a body with a first basic conductivity, a well-like region with a second conductivity which is arranged horizontally centrally in the body, has a first two-level doping profile and has a first penetration depth from the first main surface into the body. In addition, this power semiconductor component has an edge structure which is arranged between the well-like region and the edge of the power semiconductor component and which comprises a plurality of field rings with a single-level doping profile, a second conductivity and a second penetration depth, wherein the first penetration depth is no more than about 50% of the second penetration depth.

17 Claims, 3 Drawing Sheets

POWER SEMICONDUCTOR ELEMENT WITH TWO-STAGE IMPURITY CONCENTRATION PROFILE

BACKGROUND OF THE INVENTION

1. Field of the Invention

The invention is directed to a power semiconductor component having at least one functional pn junction, such as a power diode, and comprising a basic body including a semiconductor material with a first conductivity, preferably including monocrystalline silicon.

2. Description of the Related Art

The prior art, by way of example according to German Patent No. DE 43 37 329 A1, discloses the method of fabricating power diodes by irradiating them with helium atom cores and/or electrons and possibly providing an additional platinum diffusion to improve particularly the switching response, specifically for use as a freewheeling diode.

European Patent No. EP 1 017 093 A1 discloses a power semiconductor component having two functional pn junctions, the reverse of which power semiconductor component has a two-level doping profile. This profile is produced by first deep diffusion with a dopant having the conductivity of the basic body, subsequent extensive abrasion of this doped region and second very shallow diffusion of a dopant with a second conductivity and a high dopant concentration.

It is an object of the invention to provide a power semiconductor component which is simple to manufacture without particle irradiation, and at the same time has small reverse currents and low forward and switching losses.

SUMMARY OF THE INVENTION

A power semiconductor component according to the invention has at least one functional pn junction for acting as a flow control valve, preferably as a diode. To this end, the power semiconductor component has a basic body with a first basic conductivity, which is usually in the form of n⁻ doping, frequently with n doping with a low doping concentration of typically between about $10^{13}$ and about $10^{14}$ cm$^{-3}$. Embedded in this basic body, and arranged horizontally centrally on a first side adjoining a first main surface thereof, the power semiconductor component has a well-like region of second conductivity, this region having a first two-level dopant profile and a first penetration depth from the first main surface into the basic body. In this context, it is preferred if the level of the two-level doping profile of the well-like region is in the range of between about 10% and about 40% for the first penetration depth. To provide electrical contact-connection by a metal contact layer, it is further advantageous if the concentration of second dopant atoms on the first main surface of the well-like region is between about $10^{17}$ and about $10^{20}$ cm$^{-2}$. In this case and subsequently, the penetration depth of a doping profile is intended to be understood to mean the distance from that surface from which the doping is effected at which the dopant concentration reaches the absolute value of the basic doping.

Arranged between this well-like region and the edge of the power semiconductor component, likewise on the first main surface, is an edge structure comprising a plurality of field rings having a single-level dopant profile, a second conductivity and a second penetration depth. This edge structure has an associated field plate structure which is associated with the field rings and also an associated passivation. In accordance with the invention, the first penetration depth is no more than about 50% of the second penetration depth.

The field plate structure is produced from conductive moldings, associated with each field ring. Each field ring has a first body element arranged horizontally centrally thereon. Provided horizontally is a first passivation layer between these first body elements. In addition, at least one respective second body element of the conductive molding is provided which is arranged so as to be spaced apart from the basic body by the first passivation layer. In this case, this one respective second body element projects above the associated field ring horizontally in the direction of the edge of the power semiconductor component. In addition, it may be preferred if at least one, or a further, second, body element projects above at least one associated field ring horizontally in the direction of the center of the power semiconductor component.

Advantageously, a second passivation layer is arranged above the first passivation layer. The second passivation completely covers the conductive molding or the first passivation layer. In this case, it may also be preferred for a layer of silicon nitrite to be arranged between the first and second passivation layers.

The advantageous configuration of the associated second side adjoining the second main surface of the power semiconductor component has the following features. From the second main surface, a second two-level doping profile, with two profile elements and a first conductivity with a third penetration depth, extends into the interior of the basic body. In this case, this third penetration depth, that of the first profile element of this second doping profile, is approximately half the lateral extent of the basic body, depending on the voltage class and hence on the necessary thickness of the power semiconductor component. It is also advantageous if the second profile element has a fourth penetration depth, and this fourth penetration depth is between about 40% and about 70%, preferably between about 50% and about 60%, of the third penetration depth of the first profile element. The total penetration depth of the second doping profile is therefore identical to the penetration depth of the first profile element thereof. In addition, the fourth penetration depth of the second profile element of the second two-level doping profile is intended to be at least about 20%, preferably at least about 30%, of the lateral extent of the basic body.

It is likewise preferred if the concentration of dopant atoms on the second main surface with a first conductivity, produced by the first profile element, is at least two orders of magnitude lower than that produced by the second profile element, with the concentration of dopant atoms on the second main surface being between about $10^{18}$ and about $10^{21}$ cm$^{-2}$. Usually, this second main surface has a further contact metallization arranged on it, comparable to that of the well-like region. In this case, the specific configuration of these metallizations matches the respective external connection technology that is to be used.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
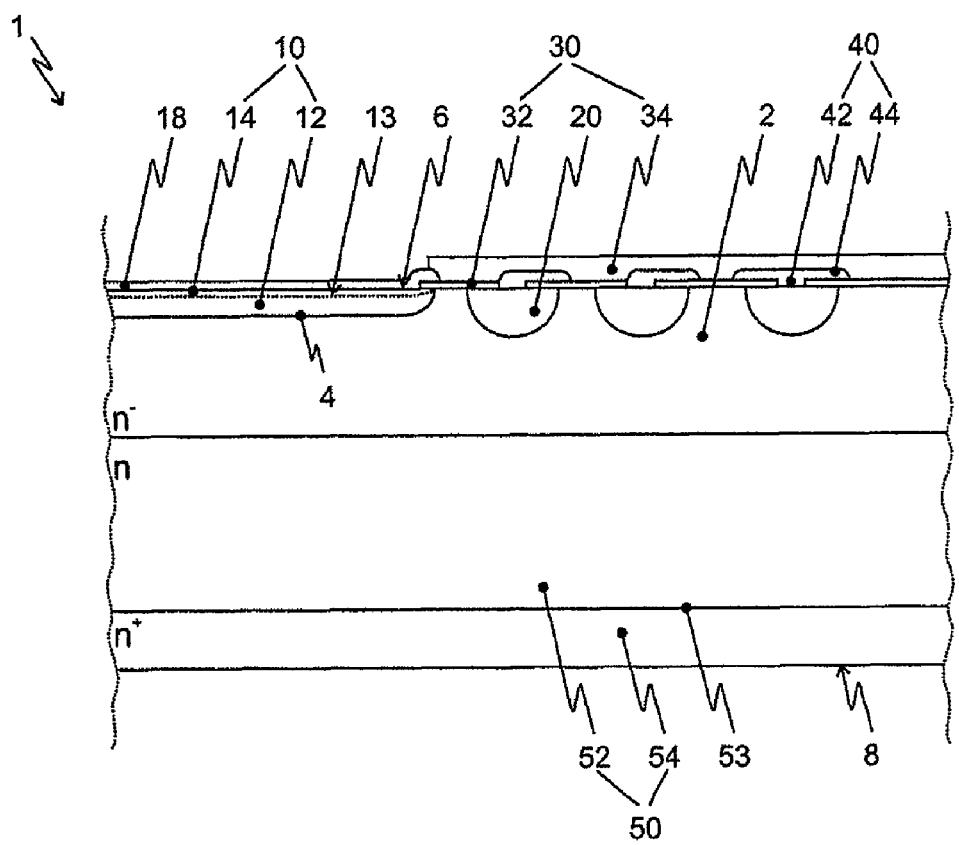
FIG. 1 shows a detail from a power semiconductor component according to the invention in cross section.
Figure 2:
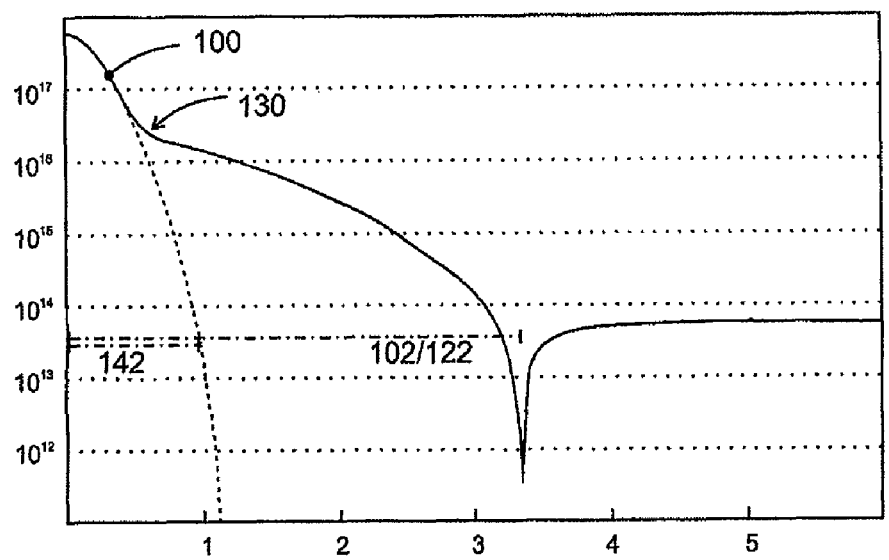
FIG. 2 shows the doping concentration on the first main surface of a power semiconductor component according to the invention.

FIG. 1 shows a detail from a power semiconductor component 1 according to the invention in cross-section, while FIG. 2 shows the associated doping concentration on the first main surface of a power semiconductor component 1 according to the invention, in this case a power diode in the 1200 V voltage class, over the thickness of power semiconductor component 1.

FIG. 1 shows a detail from a basic body 2, as known by way of example from a multiplicity of power semiconductor diodes, with a first basic conductivity, typically weak n-doping. A well-like region 10 of second, in this case p-type, conductivity extends laterally from a first main surface 6 into the interior of basic body 2 to produce a pn junction 4.

In accordance with the invention, well-like region 10 is produced by means of a two-level doping profile 100, as a result of which the total penetration depth 102 is low, in this case in the range between 3 μm and 4 μm. At the same time, the dopant concentration on the surface of well-like region 10 is sufficiently high, in this case in the range of between about $10^{17}$ and about $10^{18}$ cm$^{-2}$, in order to make the electrical resistance at the junction with a metal contact layer 18 arranged thereon sufficiently low. In this case, it is preferred if the level 130 of this first doping profile 100 is designed to be in the range from about 10% to about 40% of penetration depth 102 of the total profile. This doping profile is formed by two profile elements with a first penetration depth 122 of about 3 μm to about 4 μm, which is finally identical to total penetration depth 102 and to a second profile element with a second penetration depth 142 suitable for producing first doping profile 100.

Well-like region 10 produced in this manner is arranged horizontally centrally in basic body 2 of power semiconductor component 1 and is surrounded on all sides by an edge region. The edge region has a plurality of field rings 20 in basic body 2, which for their part are produced with a second single-level doping profile 200, (cf., FIG. 6) of second, in this case p-type, conductivity. A significant feature in this case is that penetration depth 202 of this second doping profile 200 of field rings 20 is greater than that penetration depth 102 of the first doping profile 100 of the well-like region 10. It is preferred if first penetration depth 102 is ideally up to about 30%, but no more than about 50%, of second penetration depth 202.

The edge region also has a field plate structure, wherein individual conductive moldings 40 produce this field plate structure. The respective conductive moldings 40 are produced integrally from body elements 42, 44, wherein respective first body element 42 is arranged in a horizontal direction centrally on the associated field rings and in electrical contact therewith. In this case, the entire conductive molding 40 comprises metal or suitably doped polysilicon.

Metal contact layer 18 of well-like region 10 and the first horizontally adjacent body element 42, and also all further first body elements 42, have a first passivation layer 32 arranged between them which advantageously comprises silicon oxide formed by oxidation of basic body 2 in this region.

Second body element 44 of respective conductive molding 40 is arranged so as to be spaced apart from basic body 2 and, at least in the direction of the edge, but advantageously also, at least in the case of conductive molding 40, horizontally overlaps first body element 42 such that this overlap goes beyond the horizontal extent of the associated field ring 20.

Also shown is a second passivation layer 34, preferably formed from a polyimide, which completely covers the free regions of first passivation layer 32 and also field plate structure 40. It may also be preferred for an intermediate layer comprising silicon nitrite to be arranged between two passivation layers 32, 34.

Figure 3A:
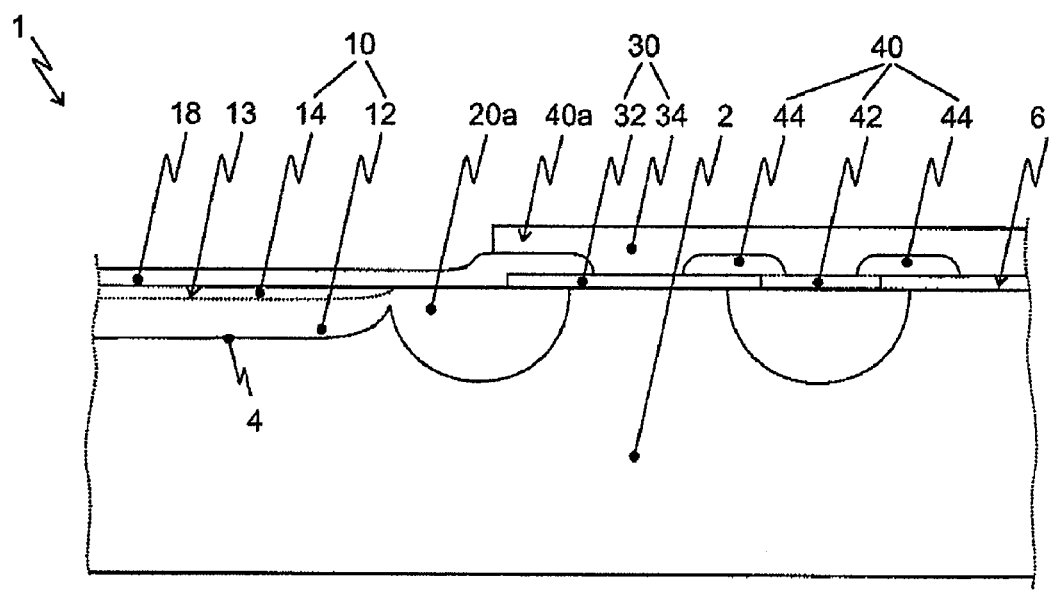
FIG. 3 shows details from two further embodiments of a power semiconductor component according to the invention.

FIG. 3 shows details from two further embodiments of a power semiconductor component 1 according to the invention. The embodiment shown in FIG. 3a differs from that shown in FIG. 1 in that a first field ring 20a overlaps well-like region 10, that is to say that there is no interval between the latter and first field ring 20a. In addition, metal contact layer 18 of well-like region 10 is in this case produced integrally with conductive molding 40a of first field ring 20a.

Figure 3B:
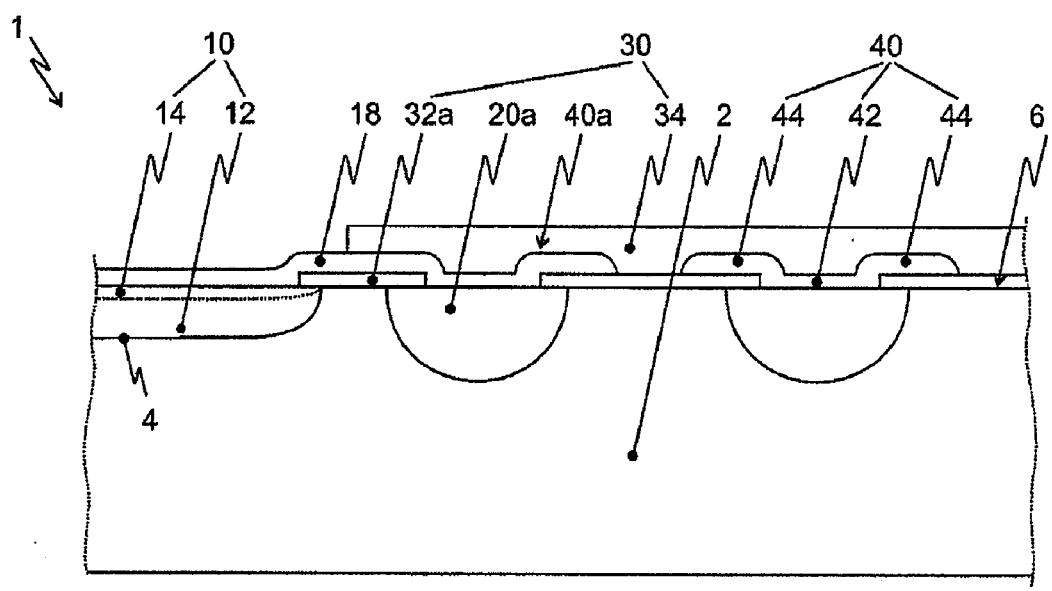

In the configuration shown in FIG. 3b, metal contact layer 18 of well-like region 10 is likewise produced integrally with conductive molding 40a of first field ring 20a, with field ring 20a in this case being spaced apart from well-like region 10 in a fashion similar to the configuration shown in FIG. 1. In this case, as in the case of the configuration shown in FIG. 1, a first passivation layer 32 is arranged in the region above basic body 2 horizontally between well-like region 10 and first body element of first conductive molding 40a of first field ring 20a.

Figure 4:
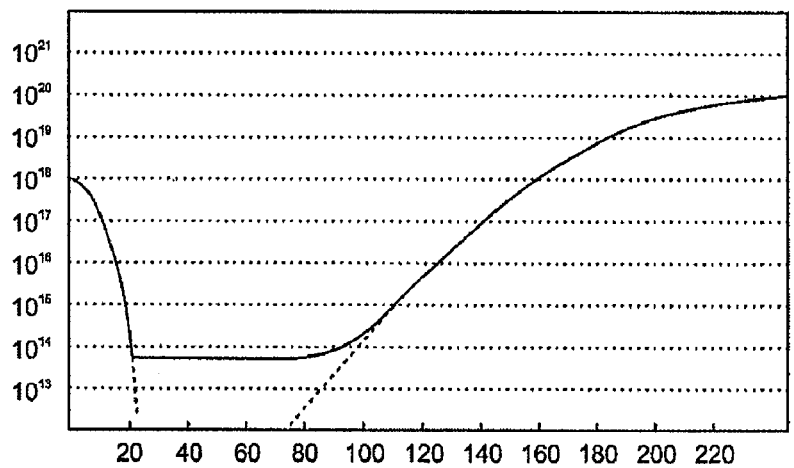
FIGS. 4 and 5 show the doping concentration of power semiconductor components based on the prior art.
Figure 5:
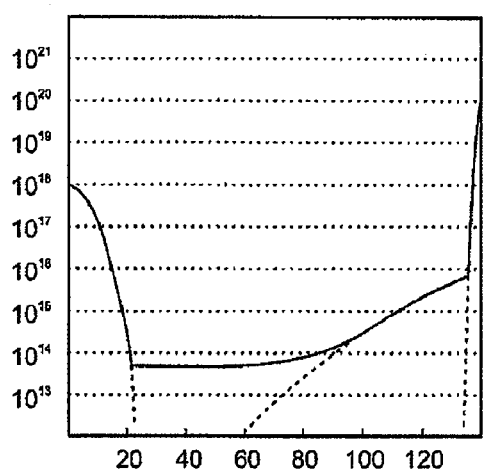

FIGS. 4 and 5 show doping concentrations plotted against the thickness of the first main surface of power semiconductor components based on the prior art. FIG. 4 shows a typical profile for a power diode in the 1200 V voltage class, with a single-level deep doping profile having been produced on the second side in this case. In the case of single-level profiles, this deep doping is necessary to produce the smallest possible slope inside the power diode at the start of the doping profile and at the same time to achieve a high dopant concentration on the surface in order to keep the electrical resistance with respect to a metal contact layer as low as possible. Such a profile therefore also requires a relatively large lateral extent, in this case of above about 240 μm, for the basic body.

FIG. 5 shows a power diode—contrastingly fabricated using thin wafer technology—in the 1200 V voltage class with a thickness of just about 140 μm and with a two-level doping profile based on the prior art, the level of this doping profile being produced almost directly on the second surface.

Figure 6:
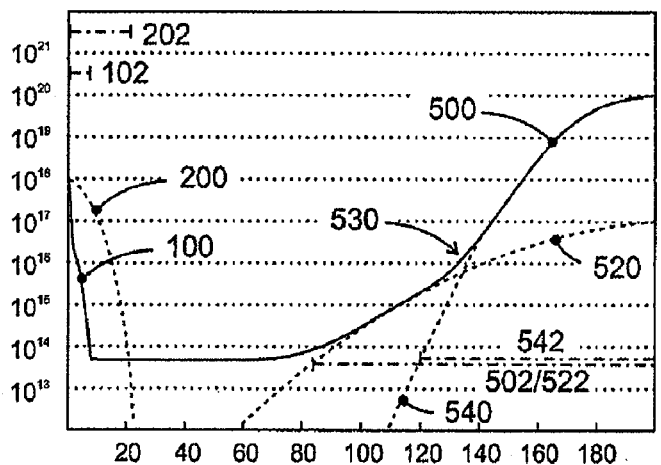
FIG. 6 shows the total doping concentration of a power semiconductor component according to the invention.

FIG. 6 shows the total doping concentration and also the doping profile of a power semiconductor component 1 according to the invention, in this case likewise of a power diode in the 1200 V voltage class, plotted against the thickness thereof from the first main surface 6 (cf., FIG. 1) onwards. A first dopant concentration as already shown in FIG. 2 is shown on the first main surface. In addition, the second doping profile 200 with a second penetration depth 202 for a field ring is shown in this case.

The second side starting from the second main surface 8 (cf., FIG. 1) has a two-level dopant profile in principle, as in the case of a power diode as shown in FIG. 5. In contrast to the prior art, however, the lateral extent of the wafer in this case is chosen to be greater in order to get around the handling drawbacks of thin wafer technology, and also the abrasion process which is required in this case. In addition, for this power diode, the penetration depth of that doping with a higher concentration of dopant atoms and the ratio of the two individual profiles forming the doping profile are chosen to be different from the prior art shown in FIG. 5.

A lower, shallow, first profile element 520 with a third penetration depth 522 and hence the entire second doping profile has a penetration depth 502 which extends laterally approximately to the center of the basic body of power diode 1 in the case of this diode in the 1200 V voltage class. The second and steeper profile element 540 has a fourth penetration depth 542 which is between about 40% and about 70%, preferably between about 50% and about 60%, of third penetration depth 522. In addition, second profile element 540 has a penetration depth 542 which is at least about 20% of the lateral extent, in this case about 200 µm, of basic body 2.

This form of second two-level doping profile 500 allows simultaneous production of a low gradient at the start of the profile and attainment of a concentration of dopant atoms on the second main surface of between about $10^{18}$ and about $10^{21}$ cm$^{-2}$. Secondly, this configuration of second two-level doping profile 500 has the lateral extent of basic body 2 above that shown in FIG. 5, which means that it is not subject to the handling drawbacks of thin wafer technology.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor component comprising:
   at least one functional pn junction;
   a body with a first basic conductivity, said body including
      a first main surface;
      a well-like region with a second conductivity arranged horizontally centrally in said body, said well-like region having a first two-level doping profile and a first penetration depth from said first main surface into said body; and
      an edge structure arranged between said well-like region and an edge of the power semiconductor component, said edge structure including a plurality of field rings each having a single-level doping profile, a second conductivity and a second penetration depth, arranged in said body, a field plate structure associated with said field rings and a passivation for said edge structure;
   wherein said first penetration depth is no more than about 50% of said second penetration depth; and
   wherein each field ring has an associated conductive molding as a field plate having a first body element arranged horizontally centrally on said field ring, wherein said first body element has a first passivation layer arranged between adjacent field rings, and having at least one second body element which is laterally spaced from said body and projects horizontally above an associated field ring in the direction of the edge of the power semiconductor component.

2. The power semiconductor component of claim 1, further comprising:
   a second body element which projects above an associated field ring horizontally in the direction of the center of the power semiconductor component.

3. The power semiconductor component of claim 1, wherein
   the concentration of second dopant atoms on said first main surface is between about $10^{17}$ and about $10^{20}$ cm$^{-2}$.

4. The power semiconductor component of claim 1, wherein
   the level of said two-level doping profile of said well-like region is in the range of from about 10% to about 40% of said first penetration depth.

5. The power semiconductor component of claim 1, further comprising:
   a metal contact layer arranged on the surface of said well-like region of second conductivity.

6. The power semiconductor component of claim 1, further comprising:
   a second passivation layer arranged above said first passivation layer.

7. The power semiconductor component of claim 6, wherein
   said first passivation layer is essentially composed of silicon oxide and said second passivation layer is essentially composed of a polyimide.

8. The power semiconductor component of claim 7, further comprising:
   a layer of silicon nitrate disposed between said first passivation layer and said second passivation layer.

9. The power semiconductor component of claim 6, wherein
   said second passivation layer completely covers said conductive moldings.

10. The power semiconductor component of claim 1, wherein
    said conductive moldings and said body elements each comprise at least one of metal or doped polysilicon.

11. The power semiconductor component of claim 1, further comprising:
    a second two-level doping profile of first conductivity having a third penetration depth extends from said second main surface into the interior of said body, wherein said third penetration depth is about 50% of the lateral extent of said body.

12. The power semiconductor component of claim 11, wherein
    said second two-level doping profile has a fourth penetration depth, and said fourth penetration depth of said second profile element of said second two-level doping profile is between about 40% and about 70% of said third penetration depth of said first profile element.

13. The power semiconductor component of claim 1, wherein
    said fourth penetration depth of said second profile element of said second two-level doping profile is between about 50% and about 60% of said third penetration depth of said first profile element.

14. The power semiconductor component of claim 12, wherein
said fourth penetration depth of said second profile element of said second two-level doping profile is at least about 20% of the lateral extent of said body.

15. The power semiconductor component of claim 14, wherein
said fourth penetration depth of said second profile element of said second two-level doping profile is at least about 30% of the lateral extent of said body.

16. The power semiconductor component of claim 11, wherein
the concentration of dopant atoms on said second main surface with a first conductivity produced by said first profile element is at least 2 orders of magnitude lower than that produced by said second profile element.

17. The power semiconductor component of claim 16, wherein
the concentration of dopant atoms on said second main surface is between about $10^{18}$ and about $10^{21}$ cm$^{-2}$.

* * * * *